US006812698B1

United States Patent
Tsukamoto

(10) Patent No.: US 6,812,698 B1
(45) Date of Patent: Nov. 2, 2004

(54) IMAGING WITH SPIN EXCITATION WHILE KEEPING WITHIN A SPECIFIC ABSORPTION RATIO LIMIT

(75) Inventor: Tetsuji Tsukamoto, Tokyo (JP)

(73) Assignee: GE Yokogawa Medical Systems, Ltd, Tokyo (JP)

( * ) Notice: Subject to any disclaimer, the term of this patent is extended or adjusted under 35 U.S.C. 154(b) by 761 days.

(21) Appl. No.: 09/612,649

(22) Filed: Jul. 8, 2000

(51) Int. Cl.$^7$ .................................................. G01V 3/00
(52) U.S. Cl. ...................................................... 324/309
(58) Field of Search ................................ 324/309, 307, 324/318, 322, 312, 314, 300, 410, 422

(56) References Cited

U.S. PATENT DOCUMENTS

| | | | | |
|---|---|---|---|---|
| 5,280,245 A | * | 1/1994 | Pauly | 324/307 |
| 5,519,320 A | * | 5/1996 | Kanayama et al. | 324/309 |
| 5,570,019 A | * | 10/1996 | Moonen et al. | 324/309 |
| 5,798,643 A | * | 8/1998 | Werthner | 324/309 |
| 5,818,229 A | * | 10/1998 | Kanazawa | 324/309 |
| 6,426,623 B1 | * | 7/2002 | Bernstein | 324/314 |
| 6,441,613 B1 | * | 8/2002 | Rosenfeld et al. | 324/314 |
| 6,618,609 B2 | * | 9/2003 | Liu et al. | 600/419 |

FOREIGN PATENT DOCUMENTS

| | | | |
|---|---|---|---|
| EP | 001083439 A2 | * | 8/2000 |
| JP | 05-317287 | * | 12/1993 |
| JP | 07-222725 | * | 8/1995 |
| JP | 08-038447 | * | 2/1996 |
| JP | 11-253416 | * | 9/1999 |
| JP | 70282 | * | 3/2001 |

* cited by examiner

Primary Examiner—Christopher W. Fulton
Assistant Examiner—Dixomara Vargas
(74) Attorney, Agent, or Firm—Moonray Kojima

(57) ABSTRACT

In order to provide a spin excitation method and apparatus for performing imaging with good efficiency while keeping within an SAR limit, and a magnetic resonance imaging apparatus employing such a spin excitation apparatus, an SAR of an object to be imaged in executing a pulse sequence is predicted (704); and at least one among the number of pulses, pulse waveform and pulse width of the RF pulses in the pulse sequence is adjusted (706) so that the predicted SAR value falls within a predetermined limit.

12 Claims, 7 Drawing Sheets

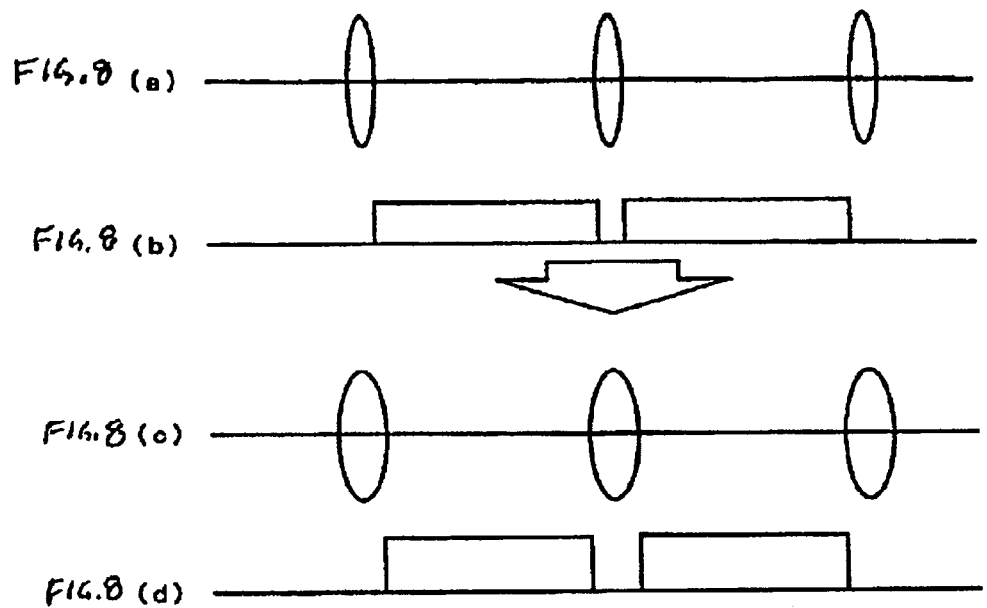
FIG. 8 (a)
FIG. 8 (b)
FIG. 8 (c)
FIG. 8 (d)
FIG. 9
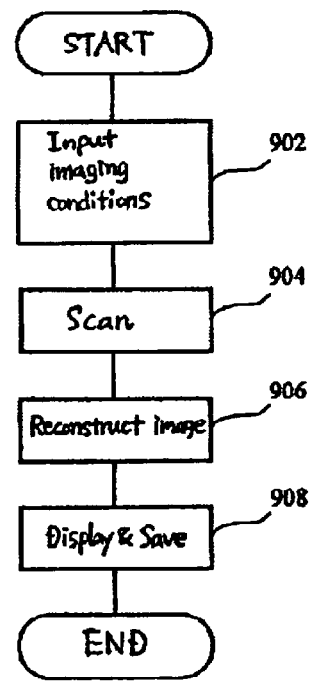

IMAGING WITH SPIN EXCITATION WHILE KEEPING WITHIN A SPECIFIC ABSORPTION RATIO LIMIT

BACKGROUND OF THE INVENTION

The present invention relates to a spin excitation method and apparatus and a magnetic resonance imaging apparatus, and more particularly to a spin excitation method and apparatus which excite spins within an object to be imaged by a pulse sequence containing RF (radio frequency) pulses, and a magnetic resonance imaging apparatus employing such a spin excitation apparatus.

When spins within an object to be imaged are RF-excited in a magnetic resonance imaging apparatus, the apparatus suppresses the SAR (specific absorption rate) by the RF excitation below a predetermined standard value to ensure safety of the object to be imaged. For this purpose, each time scan conditions are specified, the magnetic resonance imaging apparatus predicts the SAR in performing imaging under the conditions, and if the predicted SAR exceeds the standard value, the scan conditions are modified. The modification of the scan conditions is conducted automatically or by prompting an operator to re-specify the scan conditions.

Since the SAR is approximately proportional to the square of the frequency of the RF excitation signals, if the magnetic resonance imaging apparatus employs a high-strength magnetic field on, for example, the order of 3 T (Tesla) as a static magnetic field, the SAR tends to deviate from the limit due to an increase of frequency of the RF excitation signals, thereby increasing the occurrence of the scan condition modification. While the scan condition modification for reducing the SAR is usually carried out by reducing the number of slices scanned during 1 TR in multislice scanning, reducing the number of slices lowers the imaging efficiency.

SUMMARY OF THE INVENTION

It is an object of the present invention to provide a spin excitation method and apparatus for performing imaging with good efficiency while keeping within an SAR limit, and a magnetic resonance imaging apparatus employing such a spin excitation apparatus.

In accordance with a first aspect of the invention, there is provided a spin excitation method for exciting spins within an object to be imaged by a pulse sequence containing RF pulses, the method comprising the steps of predicting an SAR of the object to be imaged in executing the pulse sequence; and adjusting at least one among the number of pulses, pulse waveform and pulse width of the RF pulses in the pulse sequence so that the predicted SAR value falls within a predetermined limit.

In accordance with a second aspect of the invention, there is provided a spin excitation apparatus for exciting spins within an object to be imaged by a pulse sequence containing RF pulses, the apparatus comprising: SAR prediction means for predicting an SAR of the object to be imaged in executing the pulse sequence; and RF pulse adjusting means for adjusting at least one among the number of pulses, pulse waveform and pulse width of the RF pulses in the pulse sequence so that the predicted SAR value falls within a predetermined limit.

EFFECT

According to the present invention, at least one among the number of pulses, pulse waveform and pulse width of RF pulses in a pulse sequence is adjusted so that a predicted SAR value falls within a predetermined limit. Since the number of slices during 1 TR is therefore not reduced, lowering of imaging efficiency is prevented.

Therefore, the present invention can provide a spin excitation method and apparatus for performing imaging with good efficiency while keeping within an SAR limit and a magnetic resonance imaging apparatus employing such a spin excitation apparatus.

Further objects and advantages of the present invention will be apparent from the following description of the preferred embodiments of the invention as illustrated in the accompanying drawings.

BRIEF DESCRIPTION OF THE DRAWINGS

FIG. 4 Is a time chart of multislice scanning.

FIGS. 6(A)-6(C), 7(A)-7(D) and 8(A)-8(D) illustrate part of the pulse sequence shown in FIGS. 2(A)-2(E).

FIG. 9 is a flow chart of the operation of the apparatus shown in FIG. 1.

DETAILED DESCRIPTION OF THE INVENTION

Figure 1:
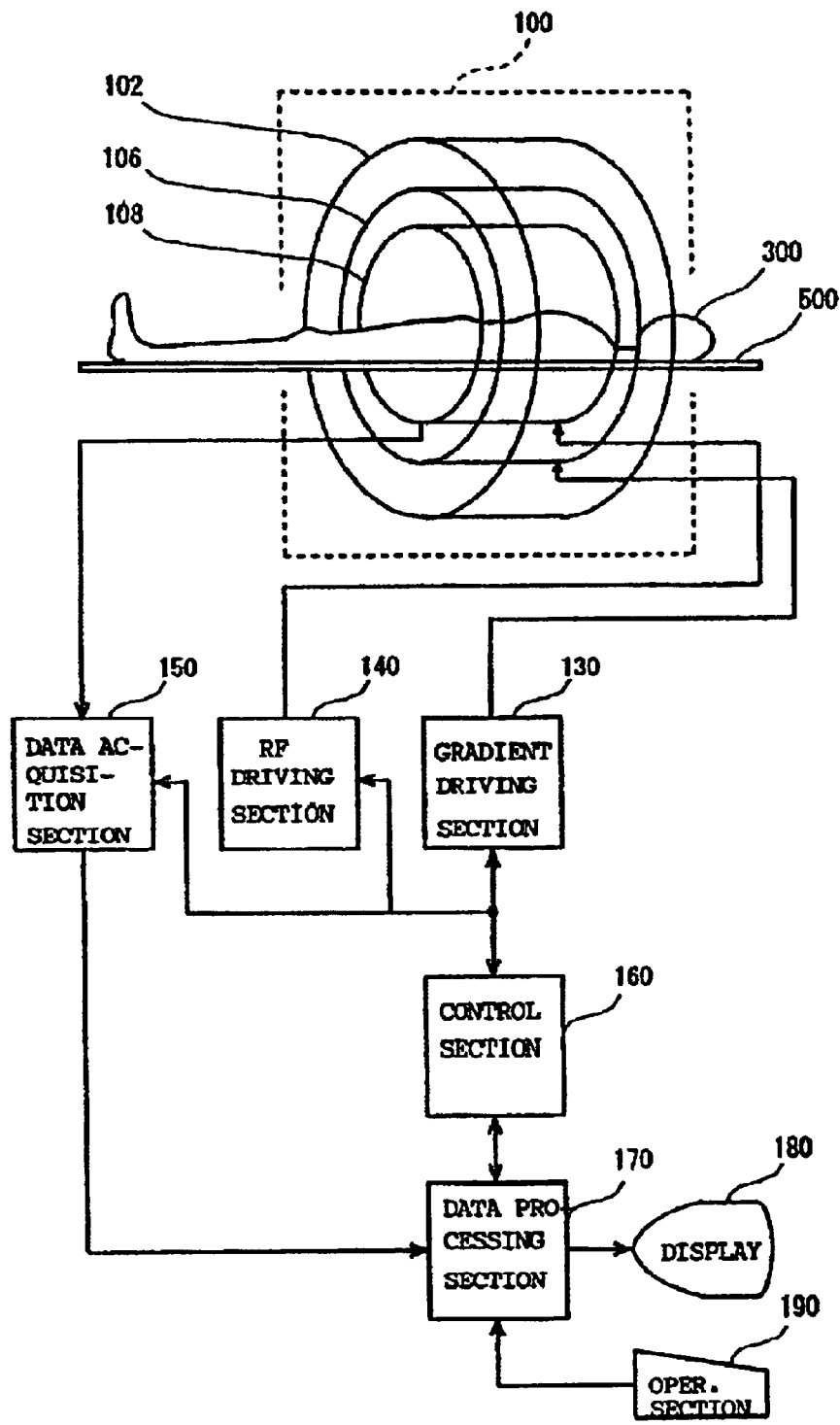
FIG. 1 is a block diagram of an apparatus in accordance with an embodiment of the present invention.

Embodiments of the present invention will now be described in detail with reference to the accompanying drawings. FIG. 1 shows a block diagram of a magnetic resonance imaging apparatus, which is an embodiment of the present invention. The configuration of the apparatus represents an embodiment of the apparatus in accordance with the present invention.

As shown in FIG. 1, the present apparatus has a magnet system 100. The magnet system 100 has a main magnetic field coil section 102, a gradient coil section 106 and an RF (radio frequency) coil section 108. These coil sections have a generally cylindrical outer shape and are concentrically disposed. An object to be imaged 300 is rested on a cradle 500 and carried into and out of the internal space of the magnet system 100 by carrier means (not shown).

The main magnetic field coil section 102 generates a static magnetic field in the internal space of the magnet system 100. The main magnetic field coil section 102 is an embodiment of the static magnetic field generating means of the present invention. The direction of the static magnetic field is generally in parallel with the direction of the body axis of the object to be imaged 300, i.e., a "horizontal" magnetic field is generated. The main magnetic field coil section 102 is made using a superconductive coil, for example. It will be easily recognized that the main magnetic field coil section 102 is not limited to a superconductive coil, but may be made using a normal conductive coil or the like.

The gradient coil section 106 generates gradient magnetic fields for imparting gradients to the static magnet field strength. The gradient magnetic fields to be generated include a slice gradient magnetic field, a readout gradient magnetic field and a phase encoding gradient magnetic field.

The gradient coil section 106 has three gradient coils (not shown) corresponding to these three gradient magnetic fields.

The RF coil section 108 generates a high frequency magnetic field for exciting spins within the object to be imaged 300. The generation of the high frequency magnetic field will be referred to as transmission of an RF excitation signal hereinbelow. The RF coil section 108 also receives an electromagnetic wave generated by the excited spins, i.e., a magnetic resonance signal.

The gradient coil section 106 is connected with a gradient driving section 130 for supplying driving signals to the gradient coil section 106 to generate the gradient magnetic fields. A gradient magnetic field will sometimes be referred to simply as a gradient hereinbelow. A portion consisting of the gradient coil section 106 and the gradient driving section 130 is an embodiment of the gradient magnetic field generating means of the present invention. The gradient driving section 130 has three driving circuits (not shown) corresponding to the three gradient coils in the gradient coil section 106.

The RF coil section 108 is connected with an RF driving section 140. A portion consisting of the RF coil section 108 and the RF driving section 140 is an embodiment of the transmit means of the present invention. The RF driving section 140 supplies driving signals to the RF coil section 108 to transmit the RF excitation signals, thereby exciting the spins within the object to be imaged 300.

The RF coil section 108 is also connected with a data acquisition section 150. A portion consisting of the receive coil section 110 and the data acquisition section 150 is an embodiment of the receive means of the present invention. The data acquisition section 150 gathers signals received by the RF coil section 108 and acquires the signals as digital data.

The gradient driving section 130, RF driving section 140 and data acquisition section 150 are connected with a control section 160 for controlling these sections 130–150.

The output of the data acquisition section 150 is connected to a data processing section 170. The data processing section 170 stores data gathered from the data acquisition section 150 in a memory (not shown). Thus, a data space is formed in the memory, which constitutes a two-dimensional Fourier space, i.e., a "k-space". The data processing section 170 performs a two-dimensional inverse Fourier transformation on the data in the two-dimensional Fourier space to reconstruct an image of the object to be imaged 300. The data processing section 170 is an embodiment of the image producing means of the present invention.

The data processing section 170 is connected to the control section 160. The data processing section 170 is above the control section 160 and controls the section 160. A portion consisting of the data acquisition section 150, control section 180, RF driving section 140 and RF coil section 108 is an embodiment of the spin excitation apparatus of the present invention. The configuration of the excitation apparatus represents an embodiment of the spin excitation apparatus in accordance with the present invention, and the operation of the excitation apparatus represents an embodiment of the spin excitation method in accordance with the present invention.

The data processing section 170 is connected with a display section 180 that displays the reconstructed image and several kinds of information output from the data processing section 170, and an operating section 190 that is operated by a human operator and inputs several commands, information and so forth to the data processing section 170.

The operation of the present apparatus in magnetic resonance imaging will now be described. The operation described hereinbelow proceeds under the control of the control section 160. The magnetic resonance imaging employs a pulse sequence schematically and exemplarily shown in FIGS. 2(A)-2(E). The illustrated pulse sequence is one in accordance with a fast spin echo (FSE) technique.

Figure 2:
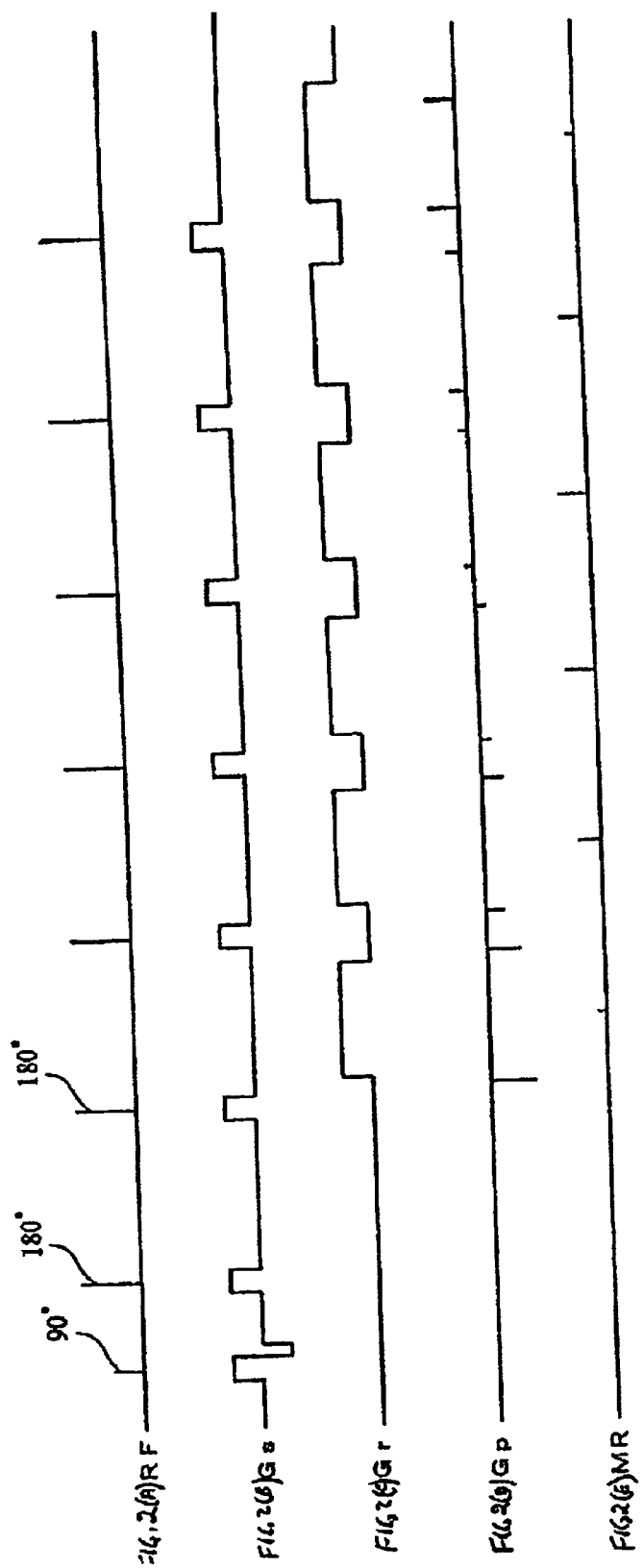
FIGS. 2(A)-2(E) illustrate an exemplary pulse sequence executed by the apparatus shown in FIG. 1.

Specifically, FIG. 2(A) is a sequence of a 90° pulse and 180° pulses for RF excitation of the FSE, and FIGS. 2(B), 2(C), 2(D) and 2(E) are sequences of a slice gradient Gs, a readout gradient Gr, a phase encoding gradient Gp and spin echoes MR of the FSE, respectively. It should be noted that the 90° and 180° pulses and the spin echoes MR are represented by their respective center signals. The pulse sequence proceeds from the left to the right along a time aids t.

As shown, 90° excitation of the spins is done by the 90° pulse. At the same time, the slice gradient Gs is applied to achieve selective excitation of a predefined slice. After the 90° excitation, a first 180° pulse is applied. Again, the slice gradient Gs is applied to achieve selective excitation of the same slice.

After the first 180° application, a 180° pulse, the slice gradient Gs, readout gradient Gr and phase encoding gradient Gp are applied at respective timings. The readout gradient Gr is applied each time the 180° pulse inverts the spins, performing readout of a spin echo.

The phase encoding gradient Gp is applied before and after each readout gradient Gr. The phase encoding gradient applied before the readout gradient Gr phase-encodes the spins, and that applied after the readout gradient Gr restores the phase encoding of the spins to zero. Thus, a plurality of spin echoes MR are sequentially generated.

A plurality of spin echoes are thus generated for one 90° excitation. The plurality of spin echoes have different phase encodings. The number of echoes here is six, but this is only for convenience of illustration. It is not limited to six but may be any appropriate number.

These spin echoes are collected as digital data in the k-space into the memory of the data processing section 170. Since the phase encodings are individually different, the echo data form separate trajectories in the k-space.

The above operation is repeated in a cycle of TR (repetition time) taking the spin relaxation time into account, to collect echo data for a separate trajectory each time, and echo data are obtained for all the trajectories by a predetermined number of times of repetition.

Figure 3:
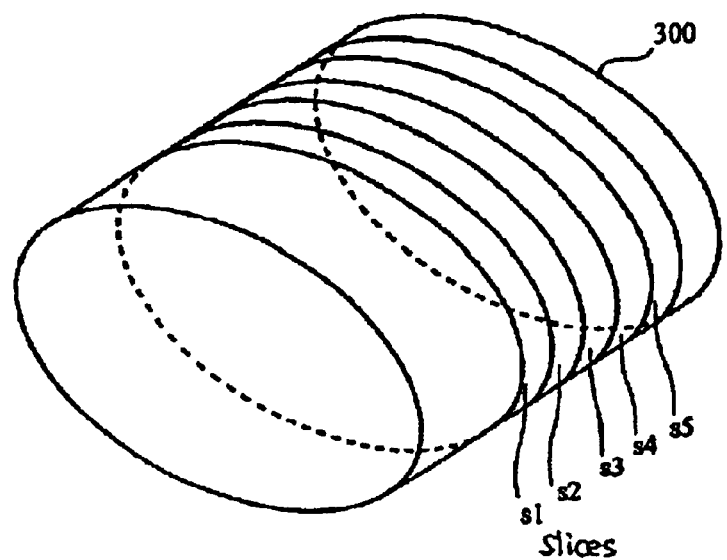
FIG. 3 illustrates the conception of multislice.

While waiting for spin relaxation of one slice, similar scanning of other slices are sequentially performed to achieve "multislice" scanning. Specifically, as exemplarily shown in FIG. 3, a slice s1 is first scanned, a slice s2 is next scanned, and thereafter, slices s3, s4, s5 are sequentially scanned. Around the time when scanning of the slice s5 is completed, the time TR has expired. Then, similar scanning is repeated again from the slice s1. A time chart of such multiscan is shown in FIG. 4.

The data processing section 170 performs a two-dimensional inverse Fourier transformation on the k-space data for each slice, and reconstructs a multislice tomographic image of the object to be imaged 300. The reconstructed image is saved in the memory, and displayed on the display section 180 as a visual image.

In performing such imaging, since RF excitation, specifically 180° excitation, is used many times, the SAR of the object to be imaged 300 is increased. The CAR markedly increases especially under a static magnetic field strength as high as 3 T.

Then, before executing the pulse sequence, the data processing section 170 calculates a predicted SAR value in executing the pulse sequence, compares the predicted value with a standard SAR value predetermined in view of safety, and it the predicted value exceeds the standard, reduces the SAR to a value conformable to the standard by adjusting the RF pulses.

Figure 5:
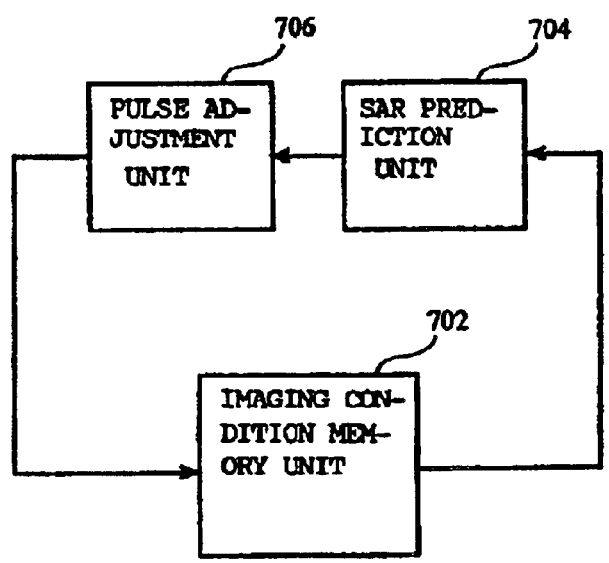
FIG. 5 is a block diagram illustrating the function of the data processing section in the apparatus shown in FIG. 1.

FIG. 5 shows a block diagram of the data processing section 170 relating to RF pulse adjustment. As shown, the data processing section 170 has an imaging condition memory unit 702, an SAR prediction unit 704 and a pulse adjustment unit 706. The imaging condition memory unit 702 is implemented by the memory of the data processing section 170. The SAR prediction unit 704 and pulse adjustment unit 706 are implemented by a computer program or the like an the data processing section 170.

The SAR prediction unit 704 is an embodiment of the SAR prediction means of the present invention. The pulse adjustment unit 708 is an embodiment of the RF pulse adjustment means of the present invention.

The SAR prediction unit 704 reads imaging conditions, i.e., a pulse sequence to be employed in imaging, out of the imaging condition memory unit 702, and predicts an SAR when scanning is performed with the pulse sequence. The prediction of the SAR is performed based on a sequence of RF pulses in the pulse sequence.

Figure 6:
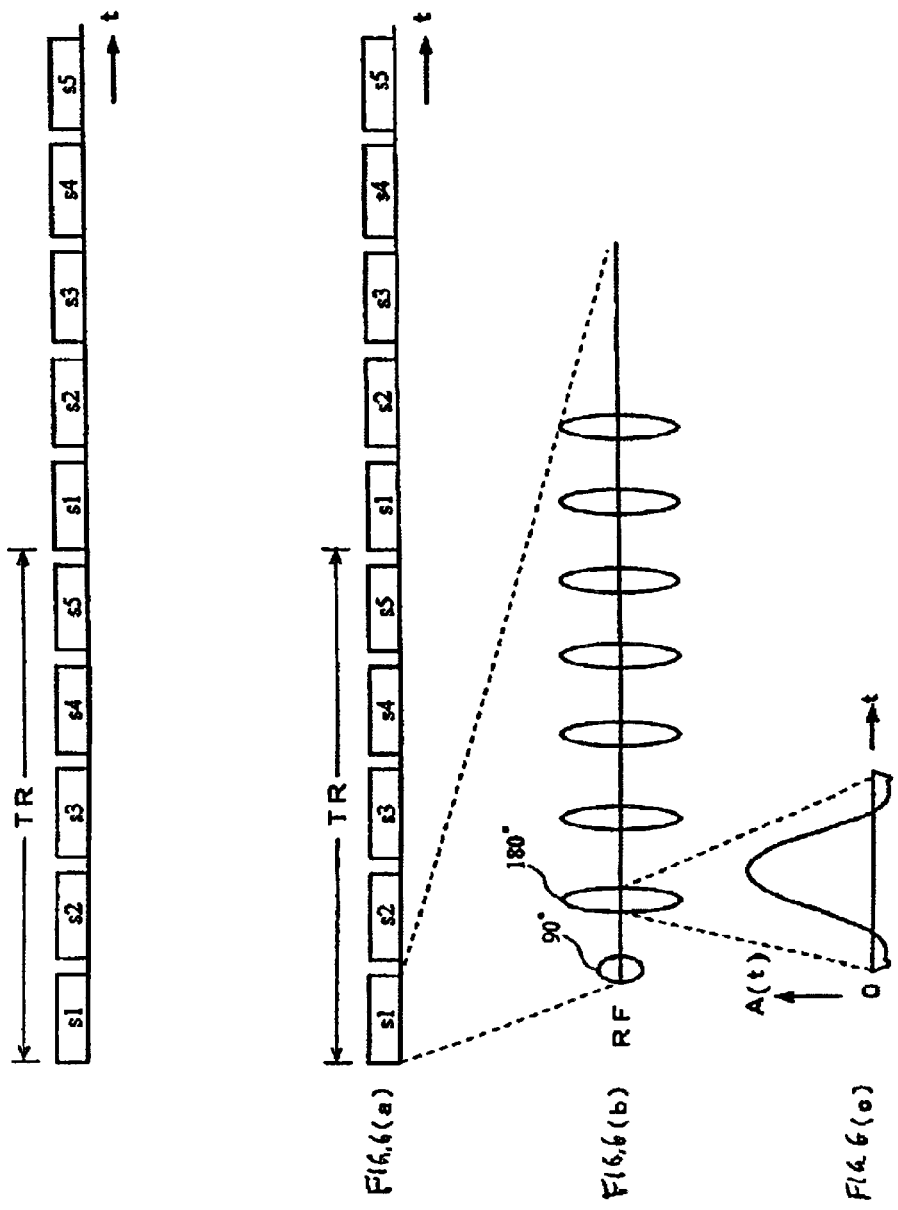

Since an instantaneous value of an RF pulse A(t) and the SAR have a relationship as follows:

$$SAR \propto \int |A(t)|^2 dt, \quad (1)$$

the SAR prediction unit 704 first calculates a value of the right side of Eq. (1) for the RF pulse sequence. Specifically, as shown in FIG. 6(b), a value of the right side of Eq. (1) is calculated for a series of 90° and 180° pulses contained in the RF pulse sequence.

The 90° and 180° pulses have a waveform as exemplarily indicated by FIG. 6(c) in default. A pulse that has such a waveform is called as an SLR (Shinnar-Le Roux) pulse. It should be noted that the area of the 90° pulse is half the area of the 180° pulse.

The SAR prediction unit 704 then checks how many normal RF pulses the calculated value of the above equation corresponds to. The value of the right side of Eq. (1) is known for a normal RF pulse, and an SAR corresponding thereto is also known from measurements. That is, for the normal RF pulse, the proportionality constant in Eq. (1) is known from measurements.

Therefore, the predicted SAR value in executing a pulse sequence can be obtained by converting the value of the right side of Eq. (1) for the RF pulses contained in the pulse sequence into the number of normal RF pulses.

The predicted SAR value thus obtained is input to the pulse adjustment unit 706. The pulse adjustment unit 706 checks the SAR predicted value based on a predetermined safety standard value. For example, the safety standard value of SAR is standardized as 3 W/kg or lower for a head.

Figure 7:
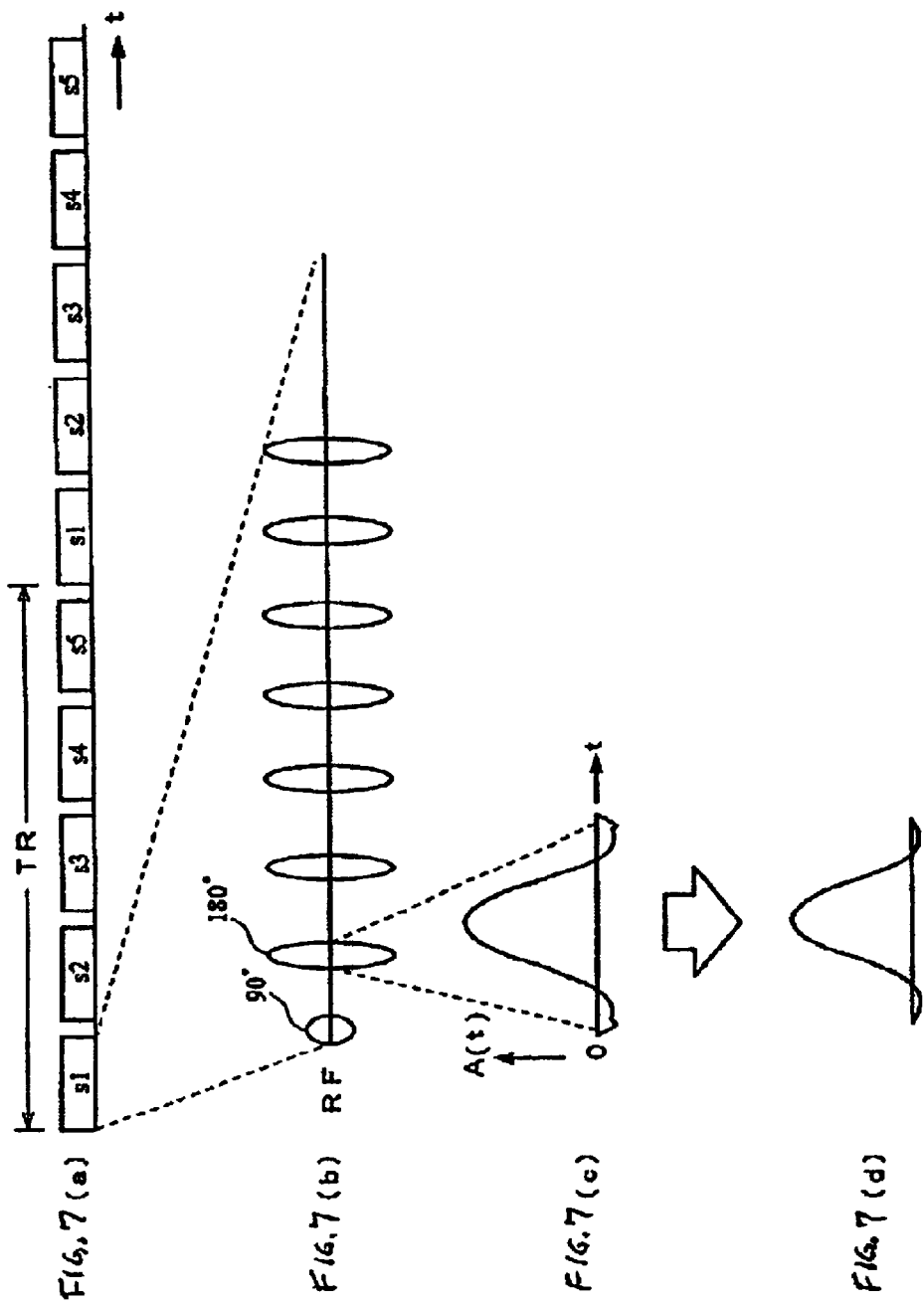

If the predicted SAR value exceeds the safety standard value, the pulse adjustment unit 706 adjust the RF pulses. As exemplarily shown in FIGS. 7(A)-7(D) the adjustment of RF pulses is achieved by, for example, modifying an original SLR pulse waveform of FIG. 7(c) into a sinc pulse waveform of FIG. 7(D). However, since the flip angle of spins and an RF pulse have a relationship as follows:

$$FlipAngle \propto \int A(t)dt, \quad (2)$$

when the waveform is changed, the value of the right side of Eq. (2), i.e., the area of a pulse, should be prevented from changing in order to maintain the same flip angle. A sinc pulse waveform satisfying such a condition generally has a smaller value of the right side of Eq. (1) than the SLR pulse waveform. Accordingly, the pulse sequence after waveform modification has a reduced SAR. Although such RF pulse adjustment is performed principally on 180° pulses, it will be easily recognized that the RF pulse adjustment may be performed on pulses including a 90° pulse.

The modification on the RF pulses for reducing the SAR is not limited to modification to a sinc pulse waveform, but a waveform may be employed which is obtained by filtering an SLR pulse waveform by, for example, a Hamming filter, Hanning filter or any other appropriate filters. Also in this case, it is possible to reduce the SAR under the condition of waveform area invariance.

Alternatively, as shown in FIGS. 8(A)-8(D) the SLR waveform may be left unchanged, while its pulse width may be widened from the state shown in FIG. 8(a) to that shown FIG. 8(c). Under the condition of area invariance, the amplitude is reduced by widening the pulse width, thereby allowing the SAR to be reduced. In this case, the readout gradient should be adjusted concurrently with the increase of the pulse width of the 180° pulse. Although omitted from the drawing, the same applies to the slice gradient Such adjustment is also included in the function of the pulse adjustment unit 706.

To reduce the SAR, the number of the 180° pulses may be reduced. This reduces the number of times of 180° excitation, hence reducing the SAR. Moreover, any one of the foregoing techniques may be solely employed, or a combination of the techniques may be employed as needed.

Then, now imaging conditions employing the RF pulses thus adjusted are stored in the imaging condition memory unit 702. The SAR prediction unit 704 again performs SAR prediction on the modified imaging conditions. If the SAR does not meet the standard, the RF pulses or the like are adjusted at the pulse adjustment unit 706. The pulse sequence is modified so that the predicted SAR value meets the standard though repeating the process.

The operation of the present apparatus will now be described. FIG. 9 shows a flow chart of the operation. As shown, imaging conditions are input at Step 902. Specifically, an user of the present apparatus inputs imaging conditions interactively using the operating section 190 and display section 180.

Figure 10:
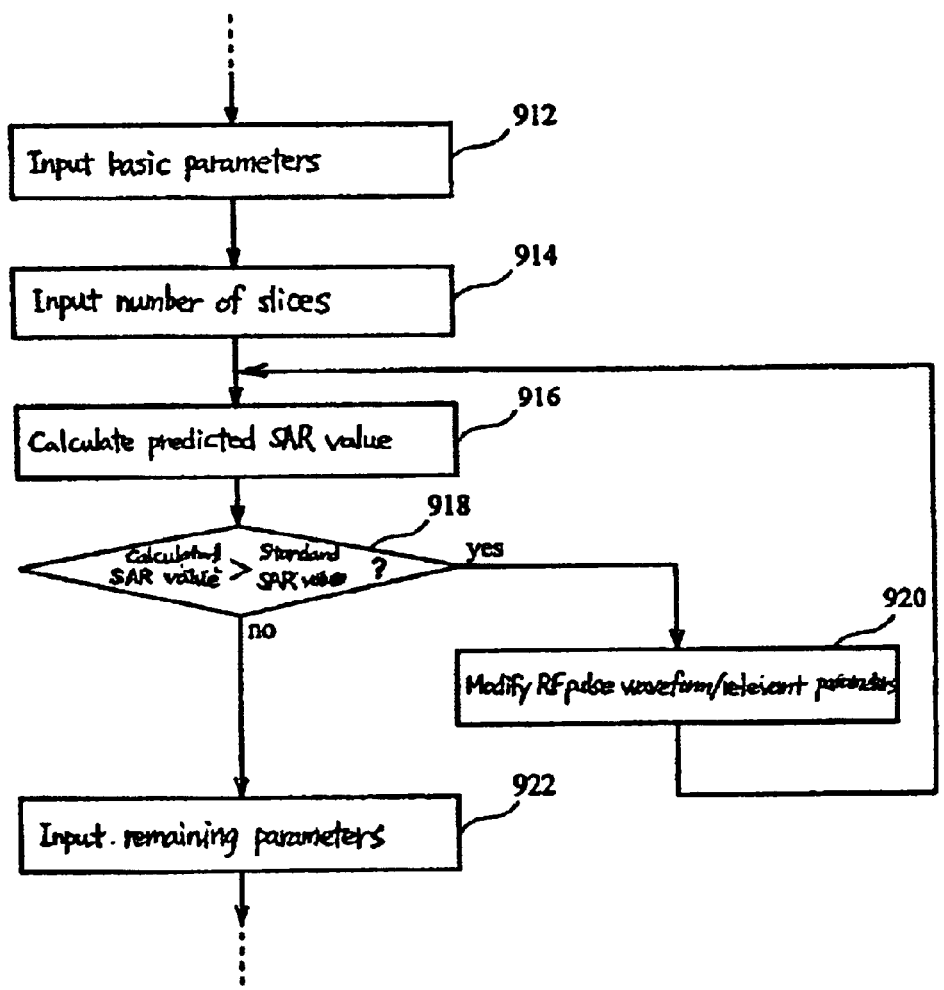
FIG. 10 is a flow chart illustrating part of the flow chart shown in FIG. 9.

A detailed flow chart of the imaging condition input is shown in FIG. 10. As shown, basic parameters relevant to imaging are input at Step 912, including, for example, the type of the pulse sequence, TR, TE (echo time), the number of echoes, FOV (field of view), the image matrix size, etc. Next, the number of slices is input at Step 914.

After inputting these parameters, a predicted SAR value is calculated at Step 916. The calculation of the predicted SAR value is performed in one of the ways described above by the SAR prediction unit 704 in the data processing section 170.

At Step 918, it is checked whether the predicted SAR value thus calculated exceeds the standard SAR value. If the predicted value is larger than the standard SAR value, the parameters of RF pulses and the like are modified at Step 920. This process is performed in a manner as described above by the pulse adjustment unit 706 in the data processing section 170.

In modifying the parameters, a plurality of options for the RF pulse waveform, including, for example, a high-SAR type, mid-SAR type, low-SAR type and the like, are preferably displayed on the display section 180 for the user to select, because this can allow the user's intention to be suitably incorporated.

After modification of the parameters, the predicted SAR value is re-calculated at Step 916, and again checked against the standard value at Step 918. The foregoing process is repeated so long as the predicted SAR value exceeds the standard value.

When the predicted SAR value becomes lower than the standard value or when it is below the standard value from the beginning, the user inputs the remaining parameters at Step 922, including, for example, the site to be imaged and the slice direction (axial, sagittal or coronal).

After inputting these imaging conditions, scanning is performed at Step 904 in the flow chart of FIG. 9. By adjusting the imaging conditions as above, the scanning is achieved within the SAR safety standard. Yet, imaging is performed with good efficiency because the number of slices is maintained as initially specified by the user.

Next, at Step 906, an image is reconstructed based on the scan data, and is displayed by the display section 180 and saved in the memory at Step 908.

Although the present invention has been described with reference to imaging by an FSE pulse sequence, the imaging is not limited to the FSE technique. The present invention is also applicable to pulse sequences according to the spin echo (SE) technique and the inversion recovery (IR) technique, and other pulse sequences that frequently use RF excitation. The same effect can be obtained in these cases.

Many widely different embodiments of the invention may be configured without departing from the spirit and the scope of the present invention. It should be understood that the present invention is not limited to the specific embodiments described in the specification, except as defined in the appended claims.

What is claimed is:

1. A spin excitation method for exciting spins within an object to be imaged by a pulse sequence containing RF pulses having SLR waveforms, said method comprising the steps of:

obtaining parameters relevant to imaging including type of pulse sequence, repetition time, echo time, number of echoes, field of view, and image matrix size, and number of slices;

calculating from said parameters a predicted SAR of said object to be imaged in executing said pulse sequence;

comparing said predicted SAR with a predetermined limit of a standard SAR; and adjusting at least one of the following characteristics of the RF pulses;

(a) modifying the SLR pulse waveform to be a sinc pulse waveform or a filtered pulse waveform;

(b) changing the pulse width of said RF pulse while leaving the SLR waveform otherwise unmodified;

(c) changing the number of RF pulses; and (d) a combination of the foregoing characteristics, to control the predicted SAR to be within said predetermined limit without reducing the number of slices during a repetition time period.

2. The method of claim 1, wherein said RF pulses are 180° pulses.

3. The method of claim 1, wherein said filtered pulse waveform is produced by a Hamming filter.

4. A spin excitation apparatus for exciting spins within an object to be imaged by a pulse sequence containing RF pulses having SLR waveforms, said apparatus comprising:

means for obtaining parameters relevant to imaging including type of pulse sequence, repetition time, echo time, number of echoes, field of view, and image matrix size, and number of slices;

means for calculating from said parameters a predicted SAR of said object to be imaged in executing said pulse sequence;

means for comparing said predicted SAR with a predetermined limit of a standard SAR; and means for adjusting at least one of the following characteristics of the RF pulses:

(a) modifying the SLR pulse waveform to be a sinc pulse waveform or a filtered pulse waveform;

(b) changing the pulse width of said RF pulse while leaving the SLR waveform otherwise unmodified;

(c) changing the number of RF pulses; and (d) a combination of the foregoing characteristics, to control the predicted SAR to be within said predetermined limit without reducing the number of slices during a repetition time period.

5. The apparatus of claim 4, wherein said means for adjusting comprises means for adjusting 180° pulses.

6. The apparatus of claim 4, wherein said means for adjusting comprises a Hamming filter to provide the filtered pulse waveform.

7. A magnetic resonance imaging apparatus comprising:

means for generating a static magnetic field in a space containing an object to be imaged;

means for generating a gradient magnetic field in said space;

means for transmitting an RF excitation signal to said space;

means for receiving a magnetic resonance signal from said space; and means for producing an image based on said received magnetic resonance signal; wherein said means for transmitting includes a spin excitation apparatus for exciting spins within said object to be imaged by a pulse sequence containing RF pulses having SLR waveforms, said excitation apparatus comprising:

means for obtaining parameters relevant to imaging including type of pulse sequence, repetition time, echo time, number of echoes, field of view, and image matrix size, and number of slices;

means for calculating from said parameters a predicted SAR of said object to be imaged in executing said pulse sequence;

means for comparing said predicted SAR with a predetermined limit of a standard SAR; and means for adjusting at least one of the following characteristics of the RF pulses:

(a) modifying the SLR pulse waveform to be a sinc pulse waveform or a filtered pulse waveform;

(b) changing the pulse width of said RF pulse while leaving the SLR waveform otherwise unmodified;

(c) changing the number of RF pulses; and (d) a combination of the foregoing characteristics, to control the predicted SAR to be within said predetermined limit without reducing the number of slices during a repetition time period.

8. The apparatus of claim 7, wherein said means for adjusting comprises means for adjusting 180° RF pulses.

9. The apparatus of claim 7, wherein said means for adjusting comprises a Hamming filter to provide the filtered pulse waveform.

10. A magnetic resonance imaging method comprising the steps of:
- (A) generating a static magnetic field in a space containing an object to be imaged;
- (B) generating a gradient magnetic field in said space;
- (C) transmitting an RF excitation signal to said space;
- (D) receiving a magnetic resonance signal from said space; and
- (E) producing an image based on said received magnetic resonance signal; wherein said transmitting step (C) includes a spin excitation procedure for exciting spins within said object to be imaged by a pulse sequence containing RF pulses having SLR waveforms, said spin excitation procedure further comprising the steps of:
- (I) obtaining parameters relevant to imaging including type of pulse sequence, repetition time, echo time, number of echoes, field of view, and image matrix size, and number of slices;
- (II) calculating from said parameters a predicted SAR of said object to be imaged in executing said pulse sequence;
- (III) comparing sadi predicted SAR with a predetermined limit of a standard SAR; and
- (IV) adjusting at least one of the following characteristics of the RF pulses:
  - (a) modifying the SLR pulse waveform to be a sinc pulse waveform or a filtered pulse waveform;
  - (b) changing the pulse width of said RF pulse while leaving the SLR waveform otherwise unmodified;
  - (c) changing number of RF pulses; and
  - (d) a combination of the foregoing characteristics; to control the predicted SAR to be within said predetermined limit without reducing the number of slices during a repetition time period.

11. The method of claim 10, wherein said RF pulses are 180° pulses.

12. The method of claim 10, wherein said filtered pulse waveform is produced by use of a Hamming filter.

* * * * *